United States Patent [19]

Nojima et al.

[11] Patent Number: 5,126,668
[45] Date of Patent: Jun. 30, 1992

[54] METHOD OF ELIMINATING THE EFFECT OF HYSTERESIS IN A SUPERCONDUCTIVE MAGNETO-RESISTIVE DEVICE

[75] Inventors: Hideo Nojima, Nara; Shoei Kataoka, Tanashi; Shuhei Tsuchimoto; Nobuo Hashizume, both of Nara, all of Japan

[73] Assignee: Sharp Kabushiki Kaisha, Osaka, Japan

[21] Appl. No.: 380,011

[22] Filed: Jul. 14, 1989

[30] Foreign Application Priority Data

Jul. 15, 1988 [JP] Japan .................................. 63-177456

[51] Int. Cl.$^5$ ..................... H01B 12/02; H01L 39/12; H01L 39/16; G01R 33/035
[52] U.S. Cl. ................................... 324/248; 324/252; 505/702; 505/845
[58] Field of Search .................... 324/248, 252, 225; 505/701, 702, 842, 845; 307/306

[56] References Cited

U.S. PATENT DOCUMENTS 4,366,494 12/1982 Ohta ................................... 324/248
4,639,806 1/1987 Kira et al. .......................... 324/252

FOREIGN PATENT DOCUMENTS 0301902 7/1988 European Pat. Off. .

OTHER PUBLICATIONS

Tsuchimoto et al. "Novel Magnetic Sensor..." Sharp Corporation Central Research Laboratories, 1987.
Japanese Journal of Applied Physics, vol. 27, No. 5, May 1988 pp. 746–750.
International Electron Devices Meeting IEDM-87 6–9, Dec. 1987, Wash. D.C. pp. 867–868 Tsuchimoto, et al.
Translation of "Superconductive Electronics" published on Dec. 10, 1985.

Primary Examiner—Walter E. Snow

[57] ABSTRACT

An apparatus for magnetic measurement using superconductive magneto-resistive film which is disposed in a magnetic field with the surface of the superconductive magneto-resistive film directed in parallel with the direction of the magnetic field so that the magnetic hysterisis property of the film can be avoided and the accuracy of the measurement can be much improved.

9 Claims, 8 Drawing Sheets

METHOD OF ELIMINATING THE EFFECT OF HYSTERESIS IN A SUPERCONDUCTIVE MAGNETO-RESISTIVE DEVICE

BACKGROUND OF THE INVENTION

1. Field of the Invention

The present invention relates to an apparatus which can measure a weak magnetic field with a higher accuracy, reliability, and stability by using a magneto-resistive device. the magneto-resistive device in composed of a ceramic superconductive film having weak coupled grain boundaries of higher sensitivity to a weak magnetic field than conventional magneto-resistive devices.

2. Description of the Prior Art

Magneto-resistive devices using semiconductors or magnetic materials are conventionally used for measuring magnetism. These magneto-resistive devices show a maximal sensitivity of about $10^{-3}$ gauss, and the sensitive property is represented by a quadratic curve to a magnetic field as shown in FIG. 1. In such a magneto-resistive device, its sensitivity becomes low when an applied magnetic field is weak.

There is a SQUID :magnetic flux meter using a superconductive sensor which is sensitive to a very weak magnetic field. The squid however, suffers from problems because it must be chilled to an extremely low temperature, and requires troublesome measuring operations.

There is proposed a highly sensitive magnetic sensor utilizing the weak coupling property of the grain boundary of the ceramic superconductor having a high critical temperature in the Japanese Patent Application No. 233369/1987. As shown in FIG. 3, the magnetic sensor of the above kind is simply constructed by a ceramic superconductor 1, current electrodes 2 and 3, and voltage electrodes 4 and 5, and can induce electrical resistance to an applied weak magnetic field as shown in FIG. 2. The electrical resistance is sharply increased corresponding to increase of the magnetic field strength.

The operation of the superconductive magneto-resistive device was examined in detail under the condition that a predetermined current was fed to the device, and that a magnetic field was applied thereto in variable strengths. As a result, it is found that it shows a hysteresis property as shown in FIG. 5.

The superconductive magneto-resistive device having the above mentioned hysteresis feature causes significant errors when detecting or measuring a weak magnetic field.

In the Japanese Patent Application No. 193018/1987, there was proposed a driving system of a superconductive magneto-resistive device which can always keep a predetermined output for an applied magnetic field strength. The proposed driving system has however a troublesome problem which is, that in order to lower a bias current to the device, once the current must be decreased to zero, and thereafter it is necessary to increase the current to set to a predetermined value, so that the device can be operated by a constant characteristic curve.

SUMMARY OF THE INVENTION

The present invention has been developed to overcome the above mentioned problems which the driving system of the conventional superconductive magneto-resistive device has been suffered, and the object of the present invention is to provide a magnetic measuring apparatus using a superconductive magneto-resistive film which can measure a magnetic value with a good operability without any of the negative effects of hysteresis.

It is considered that the magneto-resistive device of the above mentioned ceramic superconductor causes hysteresis as follows.

As shown in FIG. 11, the ceramic superconductor has such a structure has a great number of superconductive grains 14 that are coupled by sintering and the superconductor can be considered as aggregate organism of the superconductive particles weakly coupled by grain boundaries 13 formed of either extremely thin insulation films, normal conductive films or point like coupling. FIG. 12 shows an equivalent circuit of the aggregated structure which forms an aggregation of Josephson devices. When a magnetic field is applied to the ceramic superconductor, the superconductive state is collapsed from the weakly-coupled portions therein, so that the superconductor shows electrical resistance. Accordingly, as shown in FIG. 2, the resistance is increased rapidly by applying a weak magnetic field. The reason why this superconductive magneto-resistive element shows the hysteresis feature shown in FIG. 5 is as follows. With the growing of an initially applied magnetic field, a cyclic superconducting current flowing through the weak coupling to form a diamagnetic field collapses the superconductive state from the weak junctions, and permits magnetic flux to invade the superconductor. Furthermore, when reducing the magnetic field having had a strength enabling magnetic flux to invade the superconductor, superconducting current flows into the weak junctions, thereby forming a cyclic superconducting current causing magnetic flux opposite to that occurring when the magnetic field strength is increased. The difference described above affects the interior magnetic field of the superconductor.

To prevent the device from having hysteresis property, the superconductor must not permit a cyclic current to flow thereinto nor magnetic flux to be caught. These requirements, it was found out, could be satisfied when a magnetic field was applied to the device in parallel to the superconductive film surface of the device. Namely, a magnetic field was measured by using the device of a film superconductor, and the magnetic field was found to have dependence on the applied direction of the magnetic field. As a result, it was discovered that the hysteresis property of the device could be dramatically reduced when a magnetic field was applied to the device in parallel to the film surface thereof.

In the present invention, the magneto-resistive element is formed of a ceramic superconductor film on a substrate. The device is installed in parallel to a magnetic field to be applied, thereby measuring the magnetic field strength.

A ceramic superconductor, in which the grain boundaries have a hysteresis feature and show a high sensitivity to a magnetic field, is formed into a thin film of one or several grain layers; to reduce the invasion and capture of magnetic flux causing the hysteresis to a negligibly small degree, the superconductor film is provided in parallel to an applied magnetic field to be free from the effects of hysteresis, and also to utilize the superconductor features more efficiently, so that even a quick variation in a weak magnetic field can be measured precisely.

DETAILED DESCRIPTION OF THE PREFERRED EMBODIMENTS

The present invention is described more in detail taken in conjunction with preferred embodiments with reference to the accompanying drawings.

Figure 1:
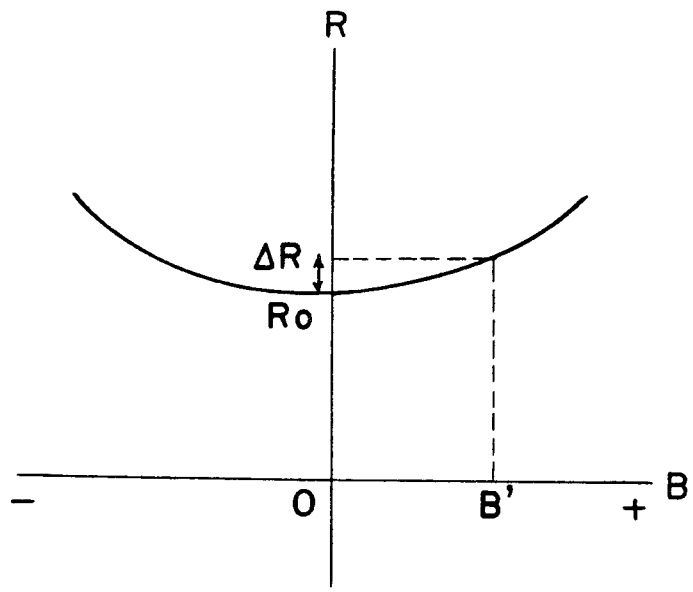
FIGS. 1 and 2 are graphs for showing the magneto-resistive effects of the conventional magneto-resistive device and ceramic superconductive magneto-resistive device.
Figure 2:
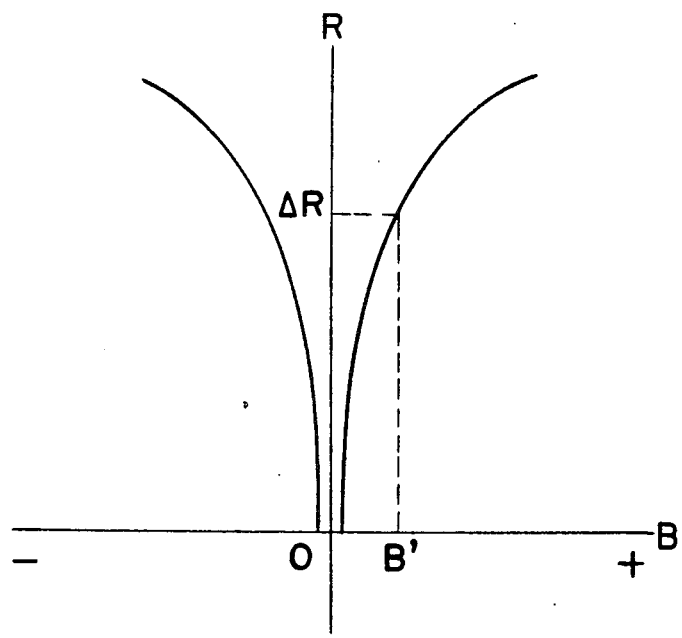
Figure 3:
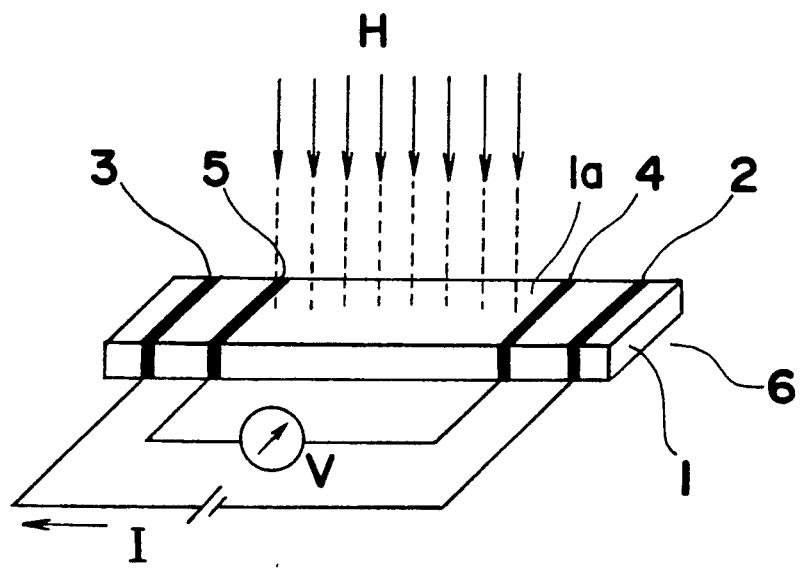
FIG. 3 is a perspective view for showing construction of a superconductive magneto-resistive device.
Figure 4:
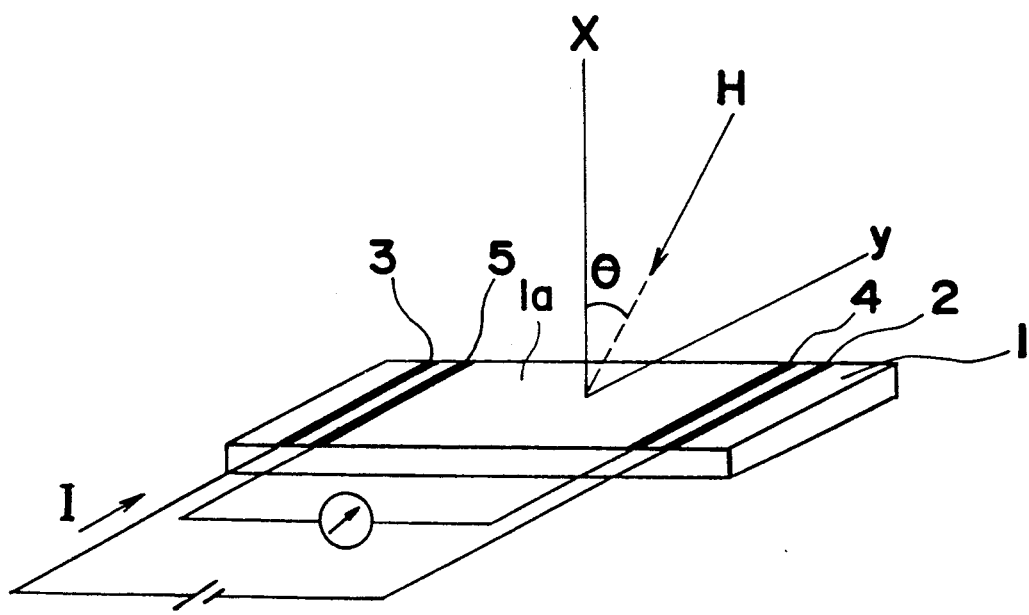
FIG. 4 is a perspective view for illustrating an embodiment of the magnetic measuring apparatus according to the present invention.
Figure 5:
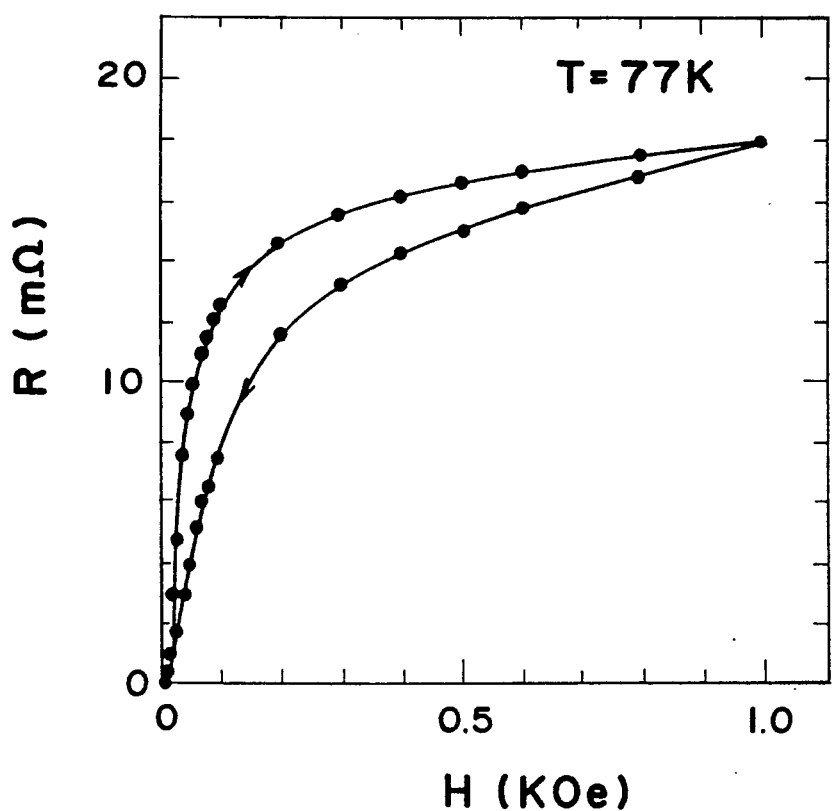
FIG. 5 is a graph for showing hysteresis occurred in the magneto-resistive effect.

FIG. 4 shows an embodiment according to the present invention, in which a ceramic superconductor 1 is formed as a thin film having a generally elongated rectangular shape, with a pair of current electrodes 2 and 3 provided near both longitudinal ends thereof. A pair of voltage terminals 4 and 5 are provided on the ceramic superconductor 1 separated inwardly form the current electrodes. A predetermined current I is fed to the device from a constant current source through the current electrodes 2 and 3, and a predetermined magnetic field H is applied to the superconductor 1. In such a state, the applied magnetic field is measured based on voltage V developed between the voltage terminals 4 and 5.

The method for manufacturing the superconductor film 1 is shown in FIG. 4.

Figure 10:
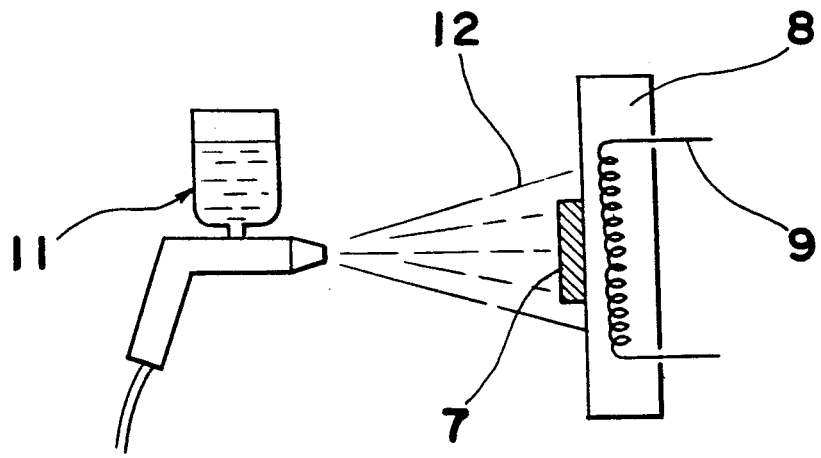
FIG. 10 is a schematic view of an apparatus for manufacturing the ceramic superconductive film employed in the embodiment of the present invention.

The superconductor is made with a film forming apparatus for ceramic superconductor films which is shown schematically in FIG. 10. Referring to FIG. 10, a substrate made of a Y-stabilized zirconia (YSZ) is fixed to a base 8 which has a large heat capacity and is heated by a heater 9. The substrate is kept at 400° C., while an aqueous solution is sprayed intermittently with an atomizer 11. As the aqueous solution, nitrate as the compositional element of the ceramic superconductor, namely, $Y(NO_3)_3 \cdot 6H_2O$, $Ba(NO_3)_2$, and $Cu(NO_3)_2 \cdot 3H_2O$ are weighed and mixed at a rate of $Y_1Ba_2Cu_3$, and they are dissolved in water to prepare the aqueous solution of the present invention. As a result, a uniform film of a thickness of 5 μm is obtained with the aid of the substrate temperature, the thermal decomposition of the nitrate, and the spray pyrolisis process which grows the $Y_1Ba_2Cu_3O_7$-x.

The prepared film was heated at 950° C. for 60 minutes in the air, and then annealed at 500° C. for 10 hours in the air to adjust the composition ratio of oxygen. The resistance of the obtained superconductor film started decreasing from 100K ($T_{co}$), reaching to zero ohm at 88K ($T_{ci}$) which is called a critical temperature.

Figure 13:
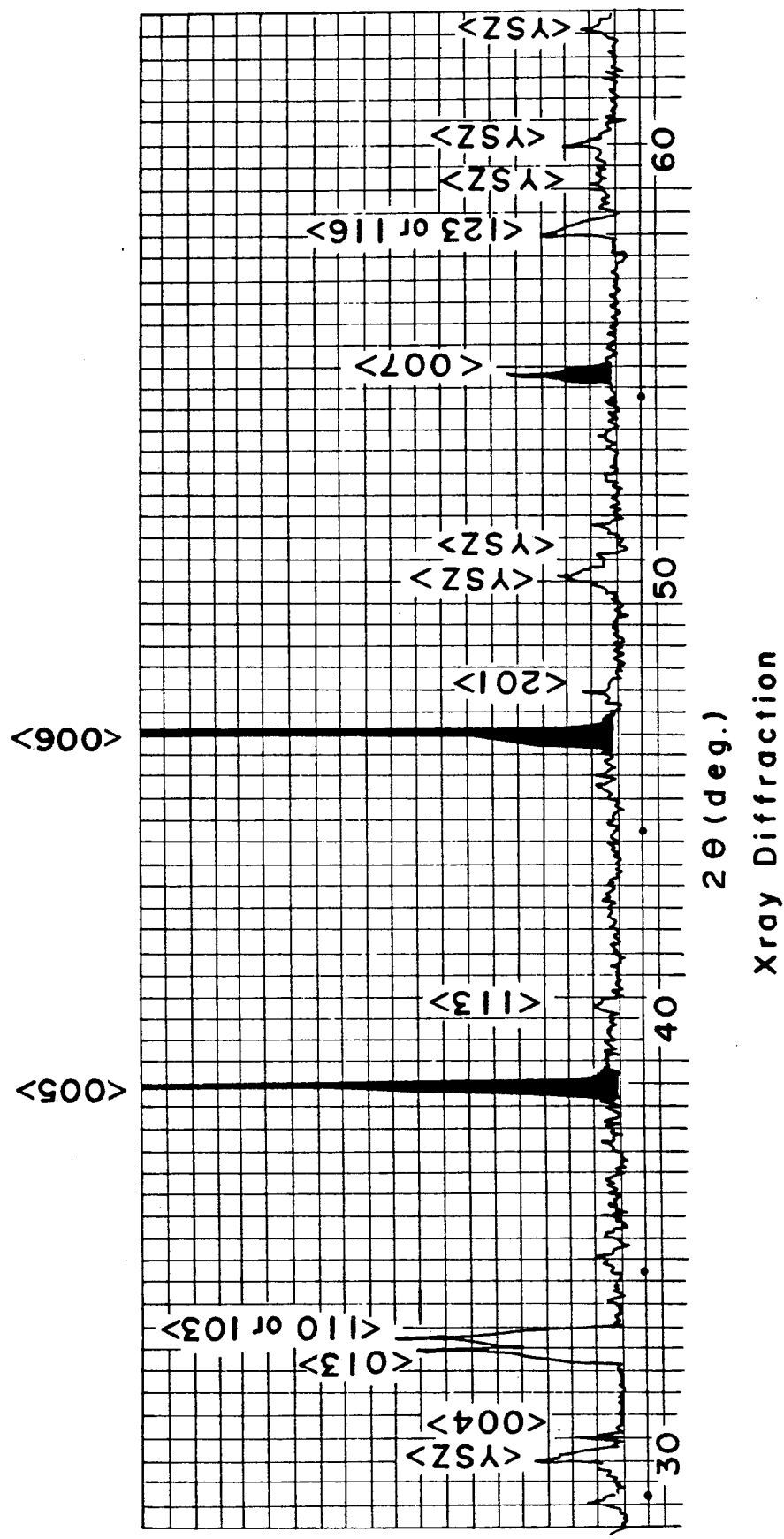
FIG. 13 is a graph for showing the characteristics of the ceramic superconductive film employed in the embodiment of the present invention, which is observed by the X-ray diffraction.

FIG. 13 is a diffraction chart for showing the measurements of the $Y_1Ba_2Cu_3O_7$-x film by the X-ray diffraction. As apparent from this chart, it can be seen that the superconductor film grows orientated along the c axis from the substrate 7.

Next, titanium, which shows a suitable property to a ceramic superconductor, was deposited on the superconductor film to form the current electrodes 2 and 3, and voltage electrodes 4 and 5 as shown in FIG. 4. Thus, a ceramic superconductive magneto-resistive device 6 was completed. The device 6 was 5 mm in width, and 10 mm in length, and the distance between the voltage electrodes 4 and 5 was 5 mm.

Current of 0.1 mA was fed to the device 6 through the current electrodes 2 and 3 for the below-mentioned measurements.

Figure 6:
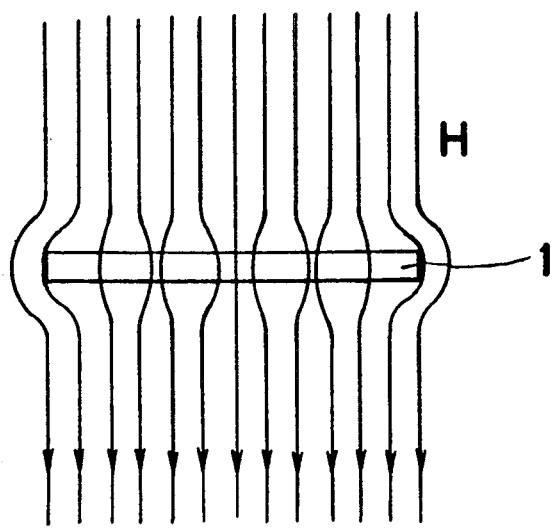
FIGS. 6 and 7 are diagrams for showing the difference in the effects of of fields of different applied directions.
Figure 7:
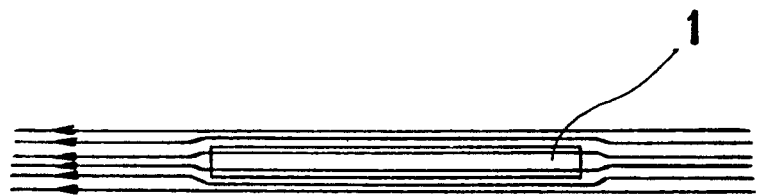
Figure 8:
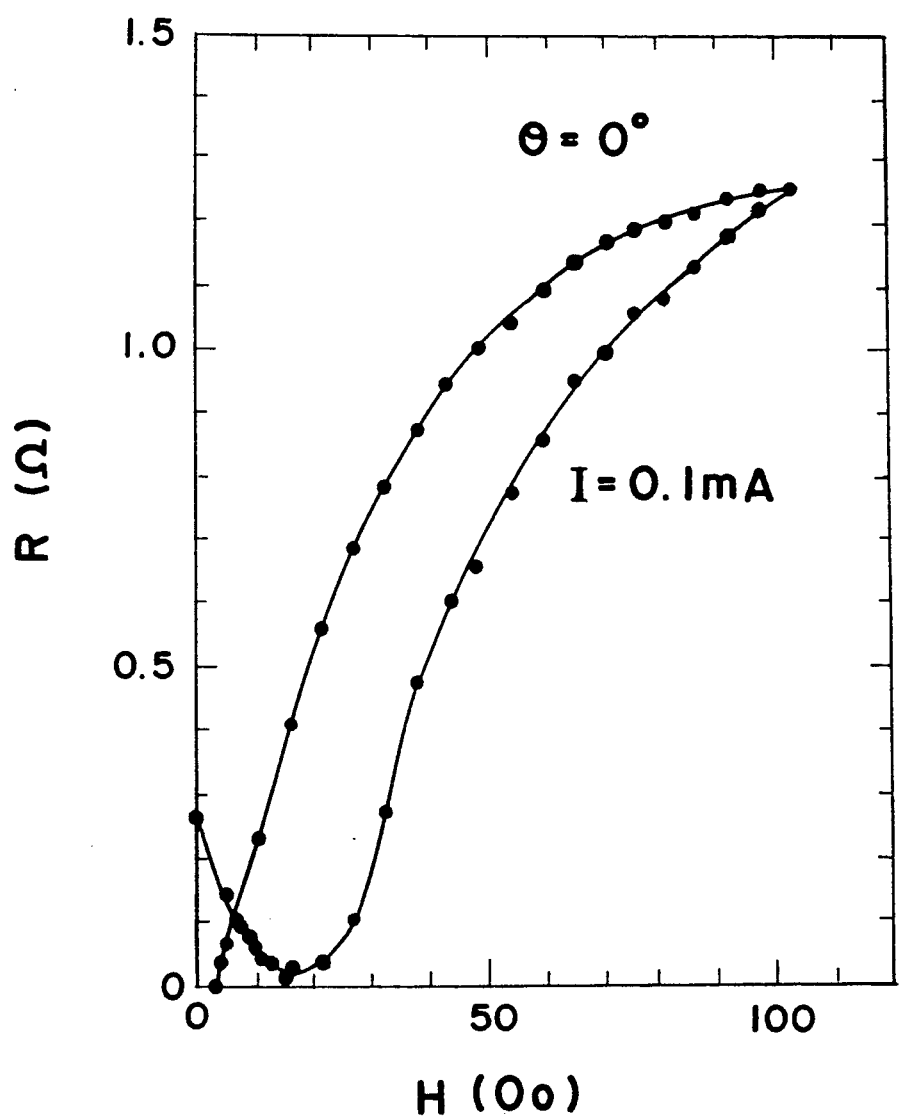
FIG. 8 is a graph for showing the magneto-resistive effect when a magnetic field is applied to the superconductive film perpendicularly thereto.
Figure 9:
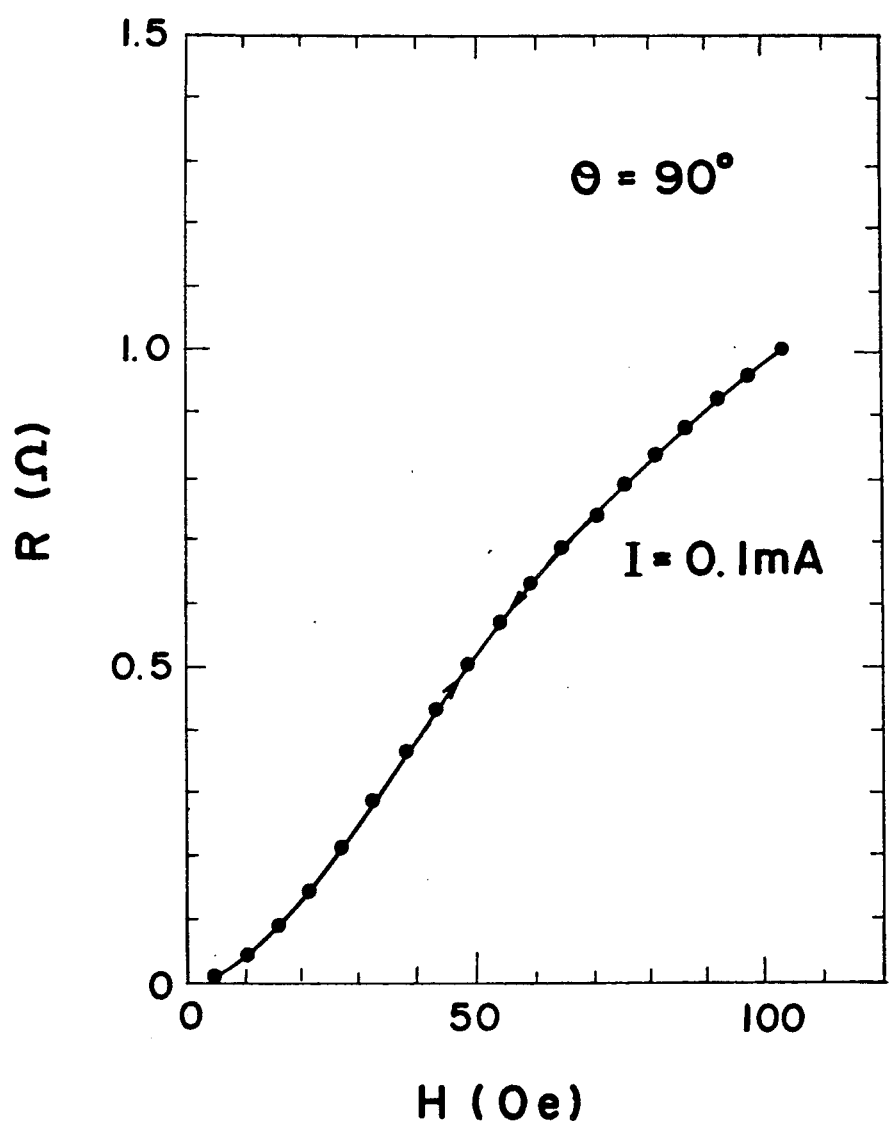
FIG. 9 is a graph for showing the magneto-resistive effect when a magnetic field is applied to the superconductive film in parallel thereto.
Figure 11:
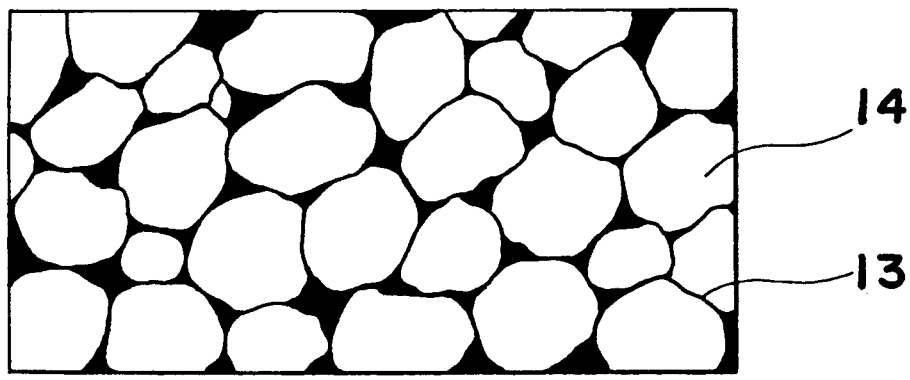
FIG. 11 shows the composition of the ceramic superconductor.
Figure 12:
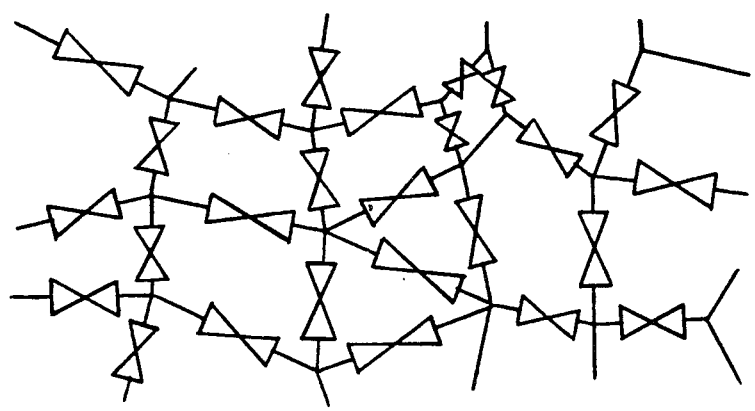
FIG. 12 is a diagram for showing the equivalent circuit of the ceramic shown in FIG. 11

The ceramic superconductive magneto-resistive device 6 was chilled to a liquid nitrogen temperature of 77 K which brought it into a superconductive state. When a magnetic field was applied in an the x axial direction which is perpendicular to the main surface 1a of the superconductive film 1 as shown in FIG. 4, the device 6 showed a hysteresis property of the resistance R in which the resistance R changes different ways depending on whether the applied magnetic field H is increasing or decreasing as shown in FIG. 8. With reference to FIG. 6, the reason why the hysterisis property of the resistance R occurs can be considered that the magnetic flux easily passes through the film surface 1a and is caught by the superconductor 1, when the magnetic field is applied to the superconductive film 1 in a direction perpendicular to the surface 1a. In contrast, when the magnetic field is applied to the superconductive film 1 in a Y axial direction which is in parallel to the surface 1a as shown in FIG. 4, the resistance R develop  in the device 6 showed the same values against the same amount of the magnetic field despite the fact that the applied magnetic field H was increasing or decreasing. Within the permissible errors in measurement, the hysteresis property of the resistance R of the device 6 did not appear. The value $\theta$ in FIG. 9 represents an angle formed by the direction of the X axis which is perpendicular to the surface 1a of the superconductive film 1 and the direction H of the magnetic field as shown in FIG. 4.

The above described superconductive magneto-resistive device 6 is an embodiment according to the present invention, and as for the ceramic superconductor, the same effects can be obtained from other film-forming process such as the sputtering process, the MOCVD process or the electron beam deposition process, not only from the spray pyrolisis process. Though this embodiment employs a superconductor of Y-Ba-Cu-O system, other superconductors may be used for obtaining the same effects, for example, superconductors as of Bi-Sr-Ca-Cu-O system, Tl-Ba-Ca-Cu-O system or the like in which the weak coupling of the grains can be formed in the grain boundaries.

It is not necessary to apply the magnetic field always in the horizontal direction against the superconductive film 1 of the device 6, but same effects can be also obtained so far as the magnetic field is applied inclined from the horizontal direction within a predetermined angular range. The angle $\theta$ defined by the axis X vertical to the surface 1a of the superconductive film 1 and the applied magnetic field H affects the sensitivity of the superconductive film, which is apparent from the comparison between the graphs of FIGS. 8 and 9, so that the sensitivity of the magnetic measurement of the device 6 can be easily controlled simply by adjusting the angle $\theta$.

The description has been so far given to the method by which the superconductive film 1 is provided in parallel with the magnetic field to be measured. However, in case where the magnetic field is not parallel with the superconductive film 1, it is possible to use a high magnetic permeable substance such as a silicon steel or permalloy, or by utilizing an absolute diamagnetic property of the superconductor, so that the magnetic field is applied in parallel to the superconductive film 1 for measurement. In this way, the strength of the applied magnetic fields of various directions relative to the superconductive film can be measured.

In the present invention, a magnetic field can be measured by the magneto-resistive device composed of a ceramic superconductive film having a high magnetic sensitivity with simple construction and excellent operability. Particularly it is possible to measure the magnetic field with a high accuracy without the effect of the hysteresis of the magneto-resistive by selecting the angle between the superconductor film and an applied magnetic field.

What is claimed is:

1. A method of measuring an applied magnetic field using an apparatus that has a single ceramic superconductive film on a substrate with two voltage electrodes operatively connected to the film, the superconducting film made up of grains of material weakly coupled to each other comprising the steps of:
   (a) placing said apparatus adjacent to an applied magnetic field;
   (b) applying the magnetic field parallel to the superconductive film; and
   (c) measuring a change in resistance of said superconductive film to indicate the strength of the applied magnetic field, the change in resistance resulting from a collapse of a superconductive state of the superconductive film.

2. The method of claim 1 wherein said applied magnetic field is a weak magnetic field.

3. The method of claim 1 wherein said magnetic field is an increasing magnetic field.

4. The method of claim 1 wherein said magnetic field is a decreasing magnetic field.

5. The method of claim 1, wherein in step (a) the applied magnetic field is located at a position defined by an angle measured from the applied magnetic field to an axis perpendicular to the superconductor film.

6. The method of claim 5 wherein said angle can vary but is less than 90°.

7. The method of claim 1 wherein said measurement is made between said voltage electrodes.

8. The method of claim 1, wherein in step (b) the magnetic field contacts the superconductive film so that there is no affect of hysteresis in the superconductive film.

9. The method of claim 1 wherein, in step (a) the apparatus and applied magnetic field are located parallel to each other.

* * * * *